United States Patent
Kim et al.

(10) Patent No.: US 12,457,826 B2
(45) Date of Patent: Oct. 28, 2025

(54) DISPLAY DEVICE HAVING LIGHT EMITTING ELEMENTS ON ORGANIC LAYER WITH SCATTERER

(71) Applicant: Samsung Display Co., LTD., Yongin-si (KR)

(72) Inventors: Hyun Kim, Yongin-si (KR); Jeong Su Park, Yongin-si (KR); Yoon Jin Kim, Yongin-si (KR); Jin Taek Kim, Yongin-si (KR); Jong Chan Lee, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 525 days.

(21) Appl. No.: 17/840,170

(22) Filed: Jun. 14, 2022

(65) Prior Publication Data

US 2023/0086576 A1    Mar. 23, 2023

(30) Foreign Application Priority Data

Sep. 23, 2021   (KR) ........................ 10-2021-0125860

(51) Int. Cl.
*H10H 20/831*     (2025.01)
*H10H 20/851*     (2025.01)
*H10H 29/14*      (2025.01)

(52) U.S. Cl.
CPC .... *H10H 20/8312* (2025.01); *H10H 20/8514* (2025.01); *H10H 29/142* (2025.01)

(58) Field of Classification Search
CPC .. H10D 86/441; H10D 86/451; H10H 20/831; H10H 20/8312; H10H 20/8506; H10H 20/851; H10H 20/8514; H10H 20/857; H10H 20/882; H10H 29/142; H01L 25/0753; H01L 25/167

See application file for complete search history.

(56) References Cited

U.S. PATENT DOCUMENTS

| | | | |
|---|---|---|---|
| 8,890,402 B2 | 11/2014 | Mori et al. | |
| 10,026,777 B2 | 7/2018 | Kang et al. | |
| 10,797,212 B2 | 10/2020 | Im et al. | |
| 11,004,892 B2 | 5/2021 | Kim et al. | |
| 2010/0033078 A1* | 2/2010 | Lee | H10K 50/854 |
| | | | 313/498 |

(Continued)

FOREIGN PATENT DOCUMENTS

| | | |
|---|---|---|
| JP | 2010-182449 | 8/2010 |
| KR | 10-2016-0015815 | 2/2016 |

(Continued)

OTHER PUBLICATIONS

International Search Report corresponding to International Application No. PCT/KR2022/014194, dated Jan. 2, 2023.

*Primary Examiner* — Nelson Garces
(74) *Attorney, Agent, or Firm* — Womble Bond Dickinson (US) LLP

(57) ABSTRACT

A display device includes a substrate including pixels, a first electrode and a second electrode spaced apart from each other on the substrate, an organic layer disposed on the first electrode and the second electrode, and light emitting elements disposed on the organic layer between the first electrode and the second electrode and the organic layer includes a scatterer.

9 Claims, 11 Drawing Sheets

(56) References Cited

U.S. PATENT DOCUMENTS

| | | | |
|---|---|---|---|
| 2021/0217739 A1 | 7/2021 | Lee et al. | |
| 2021/0242381 A1 | 8/2021 | Lee et al. | |
| 2021/0272937 A1 | 9/2021 | Lim et al. | |
| 2022/0238760 A1* | 7/2022 | Chen | H10H 20/855 |
| 2023/0006095 A1 | 1/2023 | Park et al. | |

FOREIGN PATENT DOCUMENTS

| | | |
|---|---|---|
| KR | 10-2018-0071465 | 6/2018 |
| KR | 10-2019-0042130 | 4/2019 |
| KR | 10-2020-0006651 | 1/2020 |
| KR | 10-2020-0016424 | 2/2020 |
| KR | 10-2020-0027136 | 3/2020 |
| KR | 10-2020-0115868 | 10/2020 |
| KR | 10-2020-0130606 | 11/2020 |
| KR | 10-2021-0073677 | 6/2021 |
| KR | 10-2021-0098313 | 8/2021 |

* cited by examiner

DISPLAY DEVICE HAVING LIGHT EMITTING ELEMENTS ON ORGANIC LAYER WITH SCATTERER

CROSS-REFERENCE TO RELATED APPLICATION(S)

This application claims priority to and benefits of Korean Patent Application No. 10-2021-0125860 under 35 U.S.C. § 119, filed on Sep. 23, 2021 in the Korean Intellectual Property Office, the entire contents of which are incorporated herein by reference.

BACKGROUND

1. Technical Field

The disclosure relates to a display device.

2. Description of the Related Art

As interest in an information display is increasing, research and development for a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of increasing light efficiency and a surface light source effect.

The disclosure is not limited to the above-described, and other technical objects will be clearly understood by those skilled in the art from the following description.

According to an embodiment, a display device may include a substrate including pixels; a first electrode and a second electrode spaced apart from each other on the substrate; an organic layer disposed on the first electrode and the second electrode; and light emitting elements disposed on the organic layer between the first electrode and the second electrode, and the organic layer may include a scatterer.

The display device may further include bank patterns disposed on the substrate, and the light emitting elements may be disposed between the bank patterns.

The bank patterns may be disposed on the organic layer.

The first electrode and the second electrode may be disposed between the bank patterns and the organic layer.

The organic layer and the bank patterns may include a same material.

The bank patterns may include a light blocking material.

The scatterer included in the organic layer may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$).

The display device may further include a first connection electrode electrically contacting the first electrode and an end of the light emitting elements; a second connection electrode electrically contacting the second electrode to another end of the light emitting elements; and an insulating layer disposed between the first connection electrode and the second connection electrode.

A thickness of the organic layer may be greater than a thickness of the insulating layer.

According to an embodiment, a display device may include a substrate including pixels; bank patterns disposed on the substrate, the bank patterns including a scatterer; electrodes disposed between the substrate and the bank patterns and spaced apart from each other; and light emitting elements disposed between the electrodes.

The electrodes may be coplanar.

The bank patterns may overlap the electrodes in a plan view.

The bank patterns may be directly disposed on the electrodes.

The display may further include an insulating layer disposed between the electrodes and the light emitting elements, and the bank patterns may be disposed between the insulating layer and the electrodes.

The insulating layer may be disposed directly on the bank patterns.

The insulating layer may include a scatterer.

The scatterer included in the bank patterns may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$).

The display device may further include a bank disposed at a boundary between the pixels, the bank including an opening; and a color conversion layer disposed in the opening of the bank.

The bank may include a scatterer.

The scatterer included in the bank and the scatterer included in the bank patterns may include a same material.

Details of other embodiments are included in the detailed description and drawings.

According to an embodiment, light emitted from the light emitting elements may be recycled by the scatterer of the insulating layer and/or the bank patterns, and may be emitted in a front surface direction of a display panel. Accordingly, since a light amount lost to a lower portion or a side surface of the display panel may be minimized, front surface light emission efficiency of the display device may be improved. Since a light emission luminance difference according to an emission area in the pixel may be improved, a surface light source effect may be increased.

Effects according to embodiments are not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
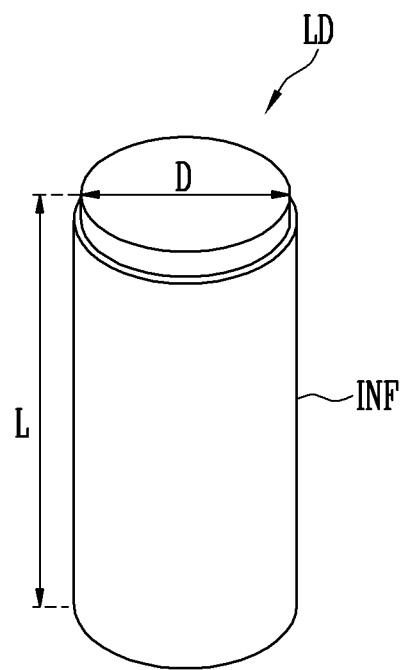
FIG. 1 is a schematic perspective view illustrating a light emitting element according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure. The disclosure may also be defined by the scope of the claims.

Terms used in the specification are for describing embodiments and are not intended to limit the disclosure.

In the drawings, sizes, thicknesses, ratios, and dimensions of the elements may be exaggerated for ease of description and for clarity. Like numbers refer to like elements throughout.

In the specification, the singular form also includes the plural form unless otherwise specified. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote the same components throughout the specification.

Although a first, a second, and the like are used to describe various components, these components are not limited by these terms. These terms are used only to distinguish one component from another component. Therefore, a first component described below may be a second component within the technical spirit of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure are described in detail with reference to the accompanying drawings.

Figure 2:
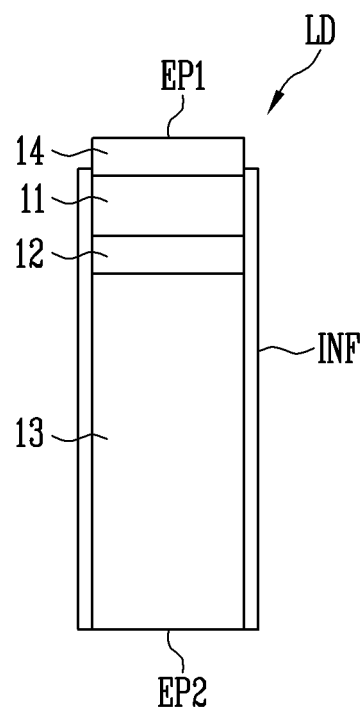
FIG. 2 is a schematic cross-sectional view illustrating a light emitting element according to an embodiment.

FIG. 1 is a schematic perspective view illustrating a light emitting element according to an embodiment. FIG. 2 is a schematic cross-sectional view illustrating a light emitting element according to an embodiment. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along one direction or a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, a light emitting element LD may be a light emitting element manufactured in a column shape through an etching method or the like within the spirit and the scope of the disclosure. In the specification, the column shape may include a rod-like shape or a bar-like shape of which an aspect ratio is greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like within the spirit and the scope of the disclosure.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, or AlN, and may include a p-type semiconductor layer doped with a first conductivity type dopant such as Mg. However, the material forming the first semiconductor layer 11 is not limited thereto, and various other materials may form the first semiconductor layer 11.

The active layer 12 may be disposed between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but is not limited thereto. The active layer 12 may include GaN, InGaN, InAlGaN, AlGaN, or AlN, and various other materials may form the active layer 12.

In case that a voltage equal to or greater than a threshold voltage is applied to both ends of the light emitting element LD, an electron-hole pair is combined in the active layer 12 and thus the light emitting element LD emits light. By controlling emission of the light emitting element LD using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, and AlN, and may include an n-type semiconductor layer doped with a second conductivity type dopant such as phosphorus Si, Ge, and Sn. However, the material forming the second semiconductor layer 13 is not limited thereto, and the second semiconductor layer 13 may be formed of various other materials.

The electrode layer 14 may be disposed on the first end EP1 and/or the second end EP2 of the light emitting element LD. FIG. 2 illustrates a case in which the electrode layer 14 is formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted to the outside of the light emitting element LD.

An insulating layer INF may be provided on a surface of the light emitting element LD. The insulating film INF may be disposed on or directly disposed on a surface of the first semiconductor layer 11, the active layer 12, the second semiconductor layer 13, and/or the electrode layer 14. The insulating film INF may expose the first and second ends EP1 and EP2 of the light emitting element LD having different polarities. According to an embodiment, the insulating film INF may expose a side portion of the electrode layer 14 and/or the second semiconductor layer 13 adjacent to the first and second ends EP1 and EP2 of the light emitting element LD.

The insulating layer INF may prevent an electrical short that may occur in case that the active layer 12 contacts a conductive material except for the first and second semiconductor layers 11 and 13. The insulating layer INF may minimize a surface defect of the light emitting elements LD, thereby improving lifespan and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). For example, the insulating film INF may be formed of a double layer, and each layer forming the double layer may include different materials. For example, the insulating film INF may be formed of a double layer formed of aluminum oxide ($AlO_x$) and silicon oxide ($SiO_x$), but is not limited thereto. According to an embodiment, the insulating film INF may be omitted.

A light emitting device including the light emitting element LD described above may be used in various types of devices that require a light source, including a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
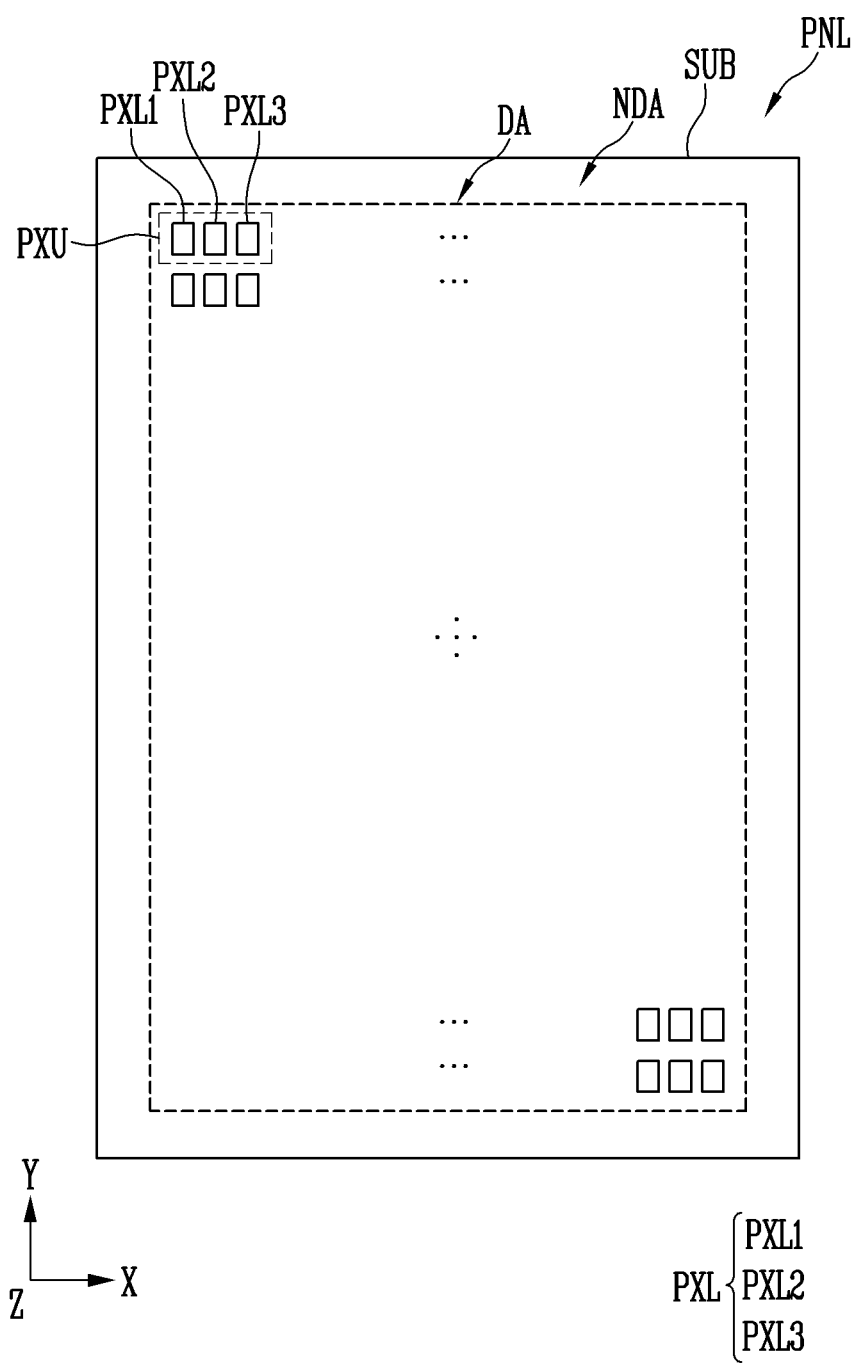
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described in the embodiments of FIGS. 1 and 2 as a light source, a display device, for example, a display panel PNL provided in the display device is shown.

For convenience of description, in FIG. 3, a structure of the display panel PNL is briefly shown based on a display area DA. However, according to an embodiment, at least one driving circuit unit (for example, at least one of a scan driver and a data driver), lines, and/or pads, which are/is not shown, may be further disposed on the display panel PNL.

Referring to FIG. 3, the display panel PNL and the substrate SUB for forming the same may include the display area DA for displaying an image and a non-display area NDA except for the display area DA. The display area DA may form a screen on which the image is displayed, and the non-display area NDA may be an area except for the display area DA.

A pixel unit PXU may be disposed in the display area DA. The pixel unit PXU may include a first pixel PXL1, a second pixel PXL2, and/or a third pixel PXL3. Hereinafter, in case that at least one pixel among the first pixel PXL1, the second pixel PXL2, and the third pixel PXL3 is arbitrarily referred to, or in case that two or more types of pixels are collectively referred to, the at least one pixel or the two or more types of pixels are referred to as a "pixel PXL" or "pixels PXL".

The pixels PXL may be regularly arranged or disposed according to a stripe or PENTILE™ arrangement structure, or the like within the spirit and the scope of the disclosure. However, the arrangement structure of the pixels PXL is not limited thereto, and the pixels PXL may be arranged or disposed in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged or disposed. At least one of the first to third pixels PXL1, PXL2, and PXL3 arranged or disposed to be adjacent to each other may form one pixel unit PXU that emits light of various colors. For example, each of the first to third pixels PXL1, PXL2, and PXL3 may be a pixel emitting light of a color. According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include light emitting elements that emit light of a same color, and may include a color conversion layer and/or a color filter layer of different colors disposed on the respective light emitting element, to emit light of the first color, the second color, and the third color, respectively. In an embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color, type, number, and/or the like of the pixels PXL forming each pixel unit PXU are/is not particularly limited. For example, the color of light emitted by each pixel PXL may be variously changed.

The pixel PXL may include at least one light source driven by a control signal (for example, a scan signal and a data signal) and/or power (for example, first power and second power). In an embodiment, the light source may include at least one light emitting element LD according to any one of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In an embodiment, each pixel PXL may be formed as an active pixel. However, a type, a structure, and/or a driving method of the pixel PXL applicable to the display device are/is not particularly limited. For example, each pixel PXL may be formed as a pixel of a passive or active light emitting display device of various structures and/or driving methods.

Figure 4:
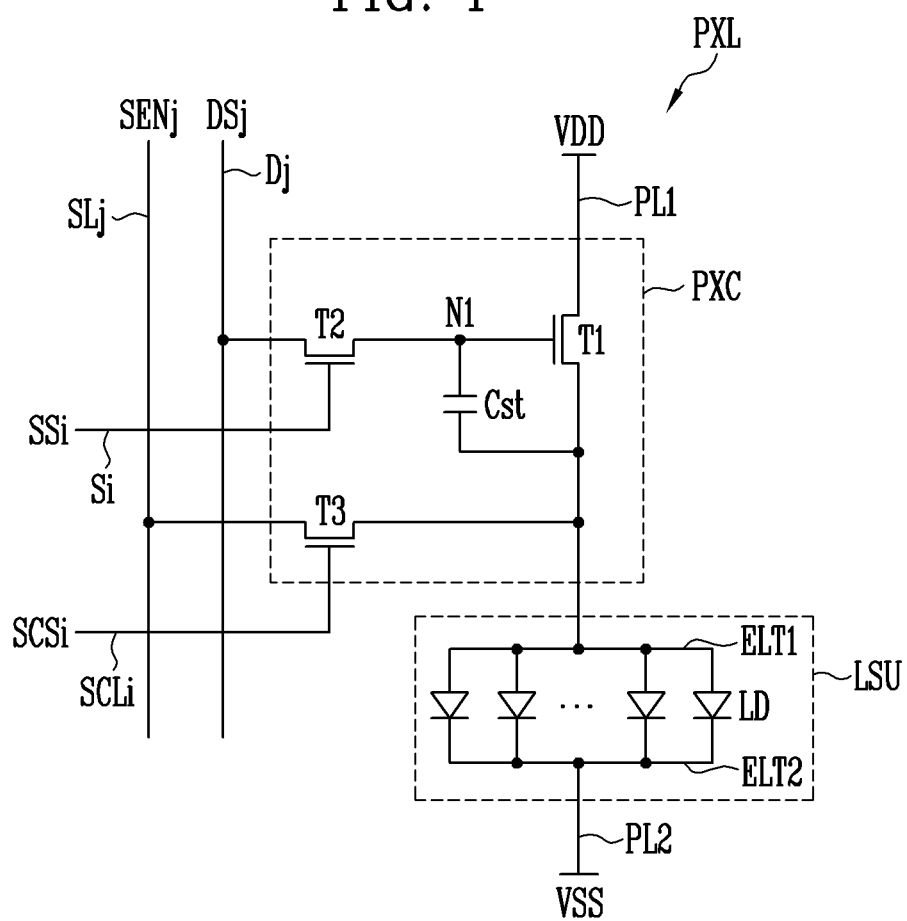
FIG. 4 is a schematic diagram of an equivalent circuit of a pixel according to an embodiment.

FIG. 4 is a schematic diagram of an equivalent circuit of a pixel according to an embodiment.

According to an embodiment, the pixel PXL shown in FIG. 4 may be any one of the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure to each other.

Referring to FIG. 4, the pixel PXL may include a light emitting unit LSU for generating light of a luminance corresponding to a data signal, and a pixel circuit PXC for driving the light emitting unit LSU.

The light emitting unit LSU may include at least one light emitting element LD connected between first power VDD and second power VSS. For example, the light emitting unit LSU may include a first electrode ELT1 connected to the first power VDD through the pixel circuit PXC and a first power line PL1, a second electrode ELT2 connected to the second power VSS through a second power line PL2, and light emitting elements LD electrically connected between the first and second electrodes ELT1 and ELT2. In an embodiment, the first electrode ELT1 may be an anode electrode, and the second electrode ELT2 may be a cathode electrode.

Each of the light emitting elements LD may include the first end connected to the first power VDD through the first electrode ELT1 and/or the pixel circuit PXC, and the second end connected to the second power VSS through the second electrode ELT2. For example, the light emitting elements LD may be connected in a forward direction between the first and second electrodes ELT1 and ELT2. Each light emitting element LD connected in the forward direction between the first power VDD and the second power VSS may form a respective effective light source, and the effective light sources may be collected to form the light emitting unit LSU of the pixel PXL.

The first power VDD and the second power VSS may have different potentials so that the light emitting elements LD may emit light. For example, the first power VDD may be set as a high potential power, and the second power VSS may be set as a low potential power. At this time, a potential difference between the first power VDD and the second power VSS may be set to be greater than or equal to a threshold voltage of the light emitting elements LD during at least emission period of the pixel PXL.

One end or an end of the light emitting elements LD forming each light emitting unit LSU may be commonly connected to the pixel circuit PXC through one electrode (for example, the first electrode ELT1 of each pixel PXL) of the light emitting unit LSU, and may be connected to the first power VDD through the pixel circuit PXC and the first power line PL1. Another end or the other end of the light emitting elements LD may be commonly connected to the second power VSS through another electrode (for example, the second electrode ELT2 of each pixel PXL) of the light emitting unit LSU and the second power line PL2.

The light emitting elements LD may emit light with a luminance corresponding to a driving current supplied through the corresponding pixel circuit PXC. For example, during each frame period, the pixel circuit PXC may supply the driving current corresponding to a grayscale value to be expressed in a corresponding frame to the light emitting unit LSU. The driving current supplied to the light emitting unit LSU may be divided and flow through the light emitting elements LD connected in the forward direction. Accordingly, the light emitting unit LSU may emit light of the luminance corresponding to the driving current while each light emitting element LD emits light with a luminance corresponding to a current flowing therein.

The pixel circuit PXC may be connected between the first power VDD and the first electrode ELT1. The pixel circuit PXC may be connected to a scan line Si and a data line Dj of a corresponding pixel PXL. For example, in case that the pixel PXL is disposed on an i-th (i is a natural number) horizontal line (row) and a j-th (j is a natural number) vertical line (column) of the display area DA, the pixel circuit PXC may be connected to the i-th scan line Si and the j-th data line Dj of the display area DA.

According to an embodiment, the pixel circuit PXC may include transistors T1, T2, and T3 and at least one storage capacitor Cst.

The first transistor T1 may be connected between the first power VDD and the light emitting unit LSU. For example, a first electrode (for example, a drain electrode) of the first transistor T1 may be connected to the first power VDD, and a second electrode (for example, a source electrode) of the first transistor T1 may be connected to the first electrode ELT1. A gate electrode of the first transistor T1 may be connected to a first node N1. The first transistor T1 may control the driving current supplied to the light emitting unit LSU in response to a voltage of the first node N1. For example, the first transistor T1 may be a driving transistor that controls the driving current of the pixel PXL.

The second transistor T2 may be connected between the data line Dj and the first node N1. For example, a first electrode of the second transistor T2 may be connected to the data line Dj, and a second electrode of the second transistor T2 may be connected to the first node N1. A gate electrode of the second transistor T2 may be connected to the scan line Si. The second transistor T2 may be turned on in case that a scan signal SSi of a gate-on voltage (for example, a high level voltage) is supplied from the scan line Si, to electrically connect the data line Dj and the first node N1.

In each frame period, a data signal DSj of the corresponding frame may be supplied to the data line Dj, and the data signal DSj may be transferred to the first node N1 through the second transistor T2 turned on during a period in which the scan signal SSi of the gate-on voltage is supplied. For example, the second transistor T2 may be a switching transistor for transferring each data signal DSj to an inside of the pixel PXL.

The third transistor T3 may be connected between the first transistor T1 and a sensing line SLj. For example, one electrode of the third transistor T3 may be connected to the second electrode (for example, the source electrode) of the first transistor T1 connected to the first electrode ELT1, and another electrode of the third transistor T3 may be connected to the sensing line SLj. In case that the sensing line SLj is omitted, the other electrode of the third transistor T3 may be connected to the data line Dj.

A gate electrode of the third transistor T3 may be connected to a sensing control line SCLi. In case that the sensing control line SCLi is omitted, the gate electrode of the third transistor T3 may be connected to the scan line Si. The third transistor T3 may be turned on by a sensing control signal SCSi of a gate-on voltage (for example, a high level voltage) supplied to the sensing control line SCLi during a sensing period, to electrically connect the sensing line SLj and the first transistor T1.

According to an embodiment, a sensing period may be a period in which a characteristic (for example, a threshold voltage or the like of the first transistor T1) of each of the pixels PXL disposed in the display area DA is extracted. During the sensing period, the first transistor may be turned on by supplying a reference voltage, at which the first transistor T1 may be turned on, to the first node N1 through the data line Dj and the second transistor T2, or connecting each pixel PXL to a current source or the like within the spirit and the scope of the disclosure. The third transistor T3 may be turned on by supplying the sensing control signal SCSi of the gate-on voltage to the third transistor T3, to connect the first transistor T1 to the sensing line SLj. Thereafter, a sensing signal SENj may be obtained through the sensing line SLj, and the characteristic of each pixel PXL including the threshold voltage or the like of the first transistor T1 may be detected using the sensing signal SENj. Information on the characteristic of each pixel PXL may be used to convert image data so that a characteristic deviation between the pixel PXL disposed in the display area DA may be compensated.

One electrode of the storage capacitor Cst may be connected to the second electrode of the first transistor T1, and another electrode may be connected to the first node N1. The storage capacitor Cst may charge a voltage corresponding to the data signal DSj supplied to the first node N1 during each frame period.

FIG. 4 shows an embodiment in which all of the effective light sources, for example, the light emitting elements LD, forming each light emitting unit LSU, are connected in parallel, but the disclosure is not limited thereto. For example, the light emitting unit LSU of each pixel PXL may be formed to include at least two stages of series structures. The light emitting elements forming each series stage may be connected in series with each other by at least one intermediate electrode.

Figure 5:
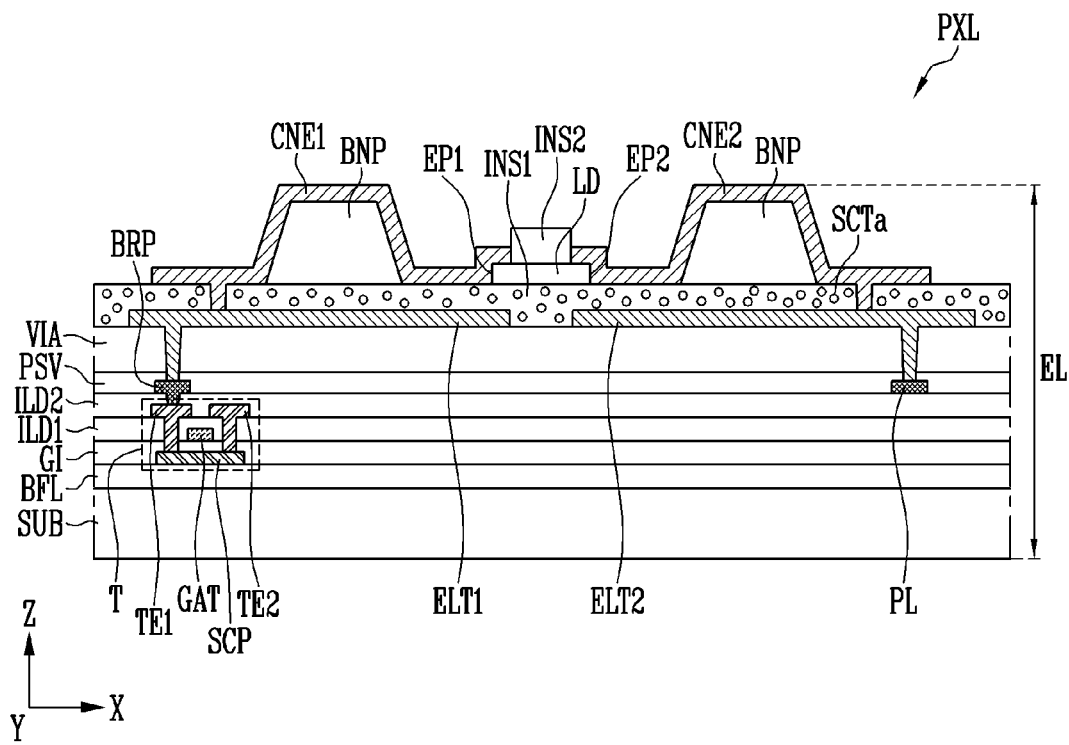
FIGS. 5 and 6 are schematic cross-sectional views illustrating a pixel according to an embodiment.
Figure 6:
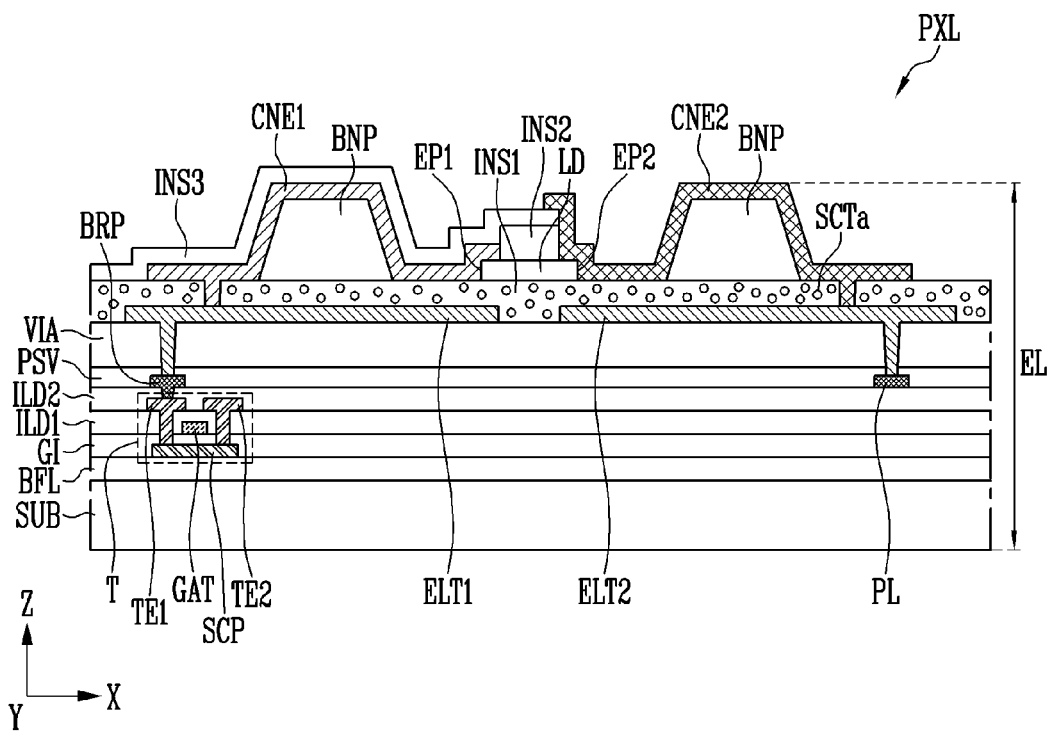

FIGS. 5 and 6 are schematic cross-sectional views illustrating a pixel according to an embodiment.

FIGS. 5 and 6 show a light emitting element layer EL of the pixel PXL. FIGS. 5 and 6 show the first transistor T1 among various circuit elements forming the pixel circuit PXC of FIG. 4, and in case that there is no need to separately describe the first to third transistors T1, T2, and T3, the first to third transistors T1, T2, and T3 are collectively referred to as "transistor T". A structure, a position of each layer, and/or the like of the transistors T are/is not limited to the embodiment shown in FIGS. 5 and 6, and may be variously changed according to an embodiment.

Referring to FIGS. 5 and 6, circuit elements, for example, transistors T and various types lines connected thereto, may be disposed on the pixels PXL and the substrate SUB of the display panel PNL including the pixels PXL according to an embodiment. First and second electrodes ELT1 and ELT2 forming the light emitting unit LSU, the light emitting elements LD, and/or first and second connection electrodes CNE1 and CNE2 may be disposed on the circuit elements.

The substrate SUB may form a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer or a layer. A material and/or a physical property of the substrate SUB are/is not limited. In an embodiment, the substrate SUB may be substantially transparent. Here, "substantially transparent" may mean that light may be transmitted at a transmittance or more. In an embodiment, the substrate SUB may be translucent or opaque. The substrate SUB may include a reflective material according to an embodiment.

The transistor T may be disposed on the substrate SUB. Each transistor T may include a semiconductor pattern SCP, a gate electrode GAT, and first and second transistor electrodes TE1 and TE2.

A buffer layer BFL may be disposed on the substrate SUB. The buffer layer BFL may prevent an impurity from being diffused into each circuit element. The buffer layer BFL may be formed of a single layer, but may be formed of multiple layers of at least two or more layers. In case that the buffer layer BFL is formed of multiple layers, each layer may be formed of a same material or a similar material or may be formed of different materials.

The semiconductor pattern SCP may be disposed on the buffer layer BFL. For example, each semiconductor pattern SCP may include a first region contacting the first transistor electrode TE1, a second region contacting the second transistor electrode TE2, and a channel region positioned between the first and second regions. According to an embodiment, one of the first and second regions may be a source region and the other may be a drain region.

According to an embodiment, the semiconductor pattern SCP may be formed of polysilicon, amorphous silicon, oxide semiconductor, or the like within the spirit and the scope of the disclosure. The channel region of the semiconductor pattern SCP may be an intrinsic semiconductor as a semiconductor pattern in which an impurity is not doped. Each of the first and second regions of the semiconductor pattern SCP may be a semiconductor doped in which an impurity is doped.

A gate insulating layer GI may be disposed on the semiconductor pattern SCP. For example, the gate insulating layer GI may be disposed between the semiconductor pattern SCP and the gate electrode GAT. The gate insulating layer GI may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The gate electrode GAT may be disposed on the gate insulating layer GI. The gate electrode GAT may be disposed to overlap the semiconductor pattern SCP in a third direction (Z-axis direction) on the gate insulating layer GI.

A first interlayer insulating layer ILD1 may be disposed on the gate electrode GAT. For example, the first interlayer insulating layer ILD1 may be disposed between the gate electrode GAT and the first and second transistor electrodes TE1 and TE2. The first interlayer insulating layer ILD1 may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first and second transistor electrodes TE1 and TE2 may be disposed on the first interlayer insulating layer ILD1. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the first interlayer insulating layer ILD1 and the gate insulating layer GI. The second transistor electrode TE2 may be electrically connected to the second region of the semiconductor pattern SCP through a contact hole passing through the first interlayer insulating layer ILD1 and the gate insulating layer GI. According to an embodiment, one of the first and second transistor electrodes TE1 and TE2 may be a source electrode, and the other may be a drain electrode.

A second interlayer insulating layer ILD2 may be disposed on the first and second transistor electrodes TE1 and TE2. For example, the second interlayer insulating layer ILD2 may be disposed between the first and second transistor electrodes TE1 and TE2 and a bridge pattern BRP. The second interlayer insulating layer ILD2 may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The bridge pattern BRP and/or a power line PL may be disposed on the second interlayer insulating layer ILD2. The bridge pattern BRP may be electrically connected to the first transistor electrode TEL For example, the bridge pattern BRP may be electrically connected to the first transistor electrode TE1 through a contact hole passing through the second interlayer insulating layer ILD2.

The power line PL may be disposed on a same layer as the bridge pattern BRP. For example, the power line PL may be formed of a same conductive layer as the bridge pattern BRP. For example, the power line PL may be simultaneously formed in a same process as the bridge pattern BRP, but is not limited thereto.

A protective layer PSV may be disposed on the bridge pattern BRP and the power line PL. The protective layer PSV may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

A via layer VIA may be disposed on the protective layer PSV. The via layer VIA may be formed of an organic material to flatten a lower step difference. For example, the via layer VIA may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the via layer VIA may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first and second electrodes ELT1 and ELT2, the bank patterns BNP, the light emitting elements LD, and/or the first and second connection electrodes CNE1 and CNE2 may be formed on the via layer VIA. The first and second electrodes ELT1 and ELT2 may be flatly disposed along one surface or a surface of the via layer VIA. For example, the first and second electrodes ELT1 and ELT2 may be disposed on a same plane or may be coplanar.

The first and second electrodes ELT1 and ELT2 may be disposed on or directly disposed on the via layer VIA. The first electrode ELT1 may be electrically connected to the bridge pattern BRP disposed thereunder through a contact hole passing through the via layer VIA and/or the protective layer PSV. The second electrode ELT2 may be electrically connected to the power line PL disposed thereunder through a contact hole passing through the via layer VIA and/or the protective layer PSV. As described above, in case that the first and second electrodes ELT1 and ELT2 are formed on or directly formed on the via layer VIA, a contact defect between the first and second electrodes ELT1 and ELT2 and circuit elements disposed thereunder may be minimized.

The first and second electrodes ELT1 and ELT2 may be disposed to be spaced apart from each other. The first and second electrodes ELT1 and ELT2 may receive an alignment signal in an alignment step of the light emitting elements LD. Accordingly, an electric field may be formed between the first and second electrodes ELT1 and ELT2, and thus the light emitting elements LD supplied to each of the pixel PXL may be aligned between the first and second electrodes ELT1 and ELT2.

Each of the first and second electrodes ELT1 and ELT2 may include at least one conductive material. For example, each of the first and second electrodes ELT1 and ELT2 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), or gallium tin oxide (GTO), and at least one conductive material among conductive polymers such as PEDOT, but is not limited thereto.

A first insulating layer INS1 may be disposed on the first and second electrodes ELT1 and ELT2. The first insulating layer INS1 may be disposed between the first and second electrodes ELT1 and ELT2 and the light emitting elements LD.

In an embodiment, the first insulating layer INS1 may be formed of an organic layer. For example, the first insulating layer INS1 may include an organic material such as an acrylates resin, an epoxy resin, a phenolic resin, a polyamides resin, a polyimides resin, a polyesters resin, a polyphenylenesulfides resin, or benzocyclobutene (BCB), but is not limited thereto.

In case that the first insulating layer INS1 is formed of an organic layer, the first insulating layer INS1 may be formed to have a relatively thick thickness. For example, the thickness of the first insulating layer INS1 may be greater than a thickness of a second insulating layer INS2 and/or a thickness of the third insulating layer INS3, which will be described later. Accordingly, the first and second electrodes ELT1 and ELT2 and the light emitting elements LD may be spaced apart from each other in the third direction (Z-axis direction) by the first insulating layer INS1. For example, in case that the light emitting elements LD are provided close to the first and second electrodes ELT1 and ELT2 in a process of aligning the light emitting elements LD, a flow speed may increase by the alignment signal applied to the first and second electrodes ELT1 and ELT2, and thus the light emitting elements LD may be separated. Therefore, according to an embodiment, since the first and second electrodes ELT1 and ELT2 and the light emitting elements LD may be spaced apart from each other by a distance by the first insulating layer INS1, a phenomenon in which the light emitting elements LD are separated may be minimized, and thus the light emitting elements LD may be more stably aligned.

In an embodiment, the first insulating layer INS1 may include a scatterer SCTa to efficiently use the light emitted from the light emitting elements LD. For example, the scatterer SCTa of the first insulating layer INS1 may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto.

The light emitted downward from the light emitting elements LD may be recycled by the scatterer SCTa of the first insulating layer INS1 and may be emitted in a front surface direction of the display panel PNL, for example, in the third direction (Z-axis direction). Accordingly, since a light amount lost to a lower portion of the display panel PNL may be minimized, front surface light emission efficiency of the display device may be improved. Since a luminance difference according to the emission area in the pixel PXL may be improved, a surface light source effect may be increased.

The bank patterns BNP may be disposed on the first insulating layer INS1. The bank patterns BNP may have various shapes according to an embodiment. In an embodiment, the bank patterns BNP may have a shape protruding in the third direction (Z-axis direction) on the substrate SUB. The bank patterns BNP may be formed to have an inclined surface inclined at an angle with respect to the substrate SUB. However, the disclosure is not limited thereto, and the bank patterns BNP may have a sidewall of a curved surface shape, a step shape, or the like within the spirit and the scope of the disclosure. For example, the bank patterns BNP may have a cross-section of a semi-circle shape, a semi-ellipse shape, or the like within the spirit and the scope of the disclosure.

The bank patterns BNP may include at least one organic material. For example, the bank patterns BNP may include a same material or a similar material as the first insulating layer INS1 described above. For example, the bank patterns BNP may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank patterns BNP may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

According to an embodiment, the bank patterns BNP may include a light blocking material to prevent color mixing between the pixels PXL. For example, the bank patterns BNP may also function as a reflective member that improves the light emission efficiency of the display panel PNL by including a reflective material to guide the light emitted from the light emitting elements LD in the front surface direction of the pixel PXL, for example, in the third direction (Z-axis direction).

The light emitting elements LD may be disposed on the first insulating layer INS1. The light emitting elements LD may be disposed between the first and second electrodes ELT1 and ELT2 on the first insulating layer INS1. The light emitting elements LD may be prepared in a dispersed form in a light emitting element ink, and may be supplied and disposed between the bank patterns BNP of each pixel PXL through an inkjet printing method or the like within the spirit and the scope of the disclosure. For example, the light emitting elements LD may be dispersed in a volatile solvent and provided to each of the pixels PXL. In case that the alignment signal is supplied through the first and second electrodes ELT1 and ELT2, the light emitting elements LD may be aligned between the first and second electrodes ELT1 and ELT2 while an electric field is formed between the first and second electrodes ELT1 and ELT2. After the light emitting elements LD are aligned, the solvent may be evaporated or removed by other methods to stably arrange the light emitting elements LD between the first and second electrodes ELT1 and ELT2.

A second insulating layer INS2 may be disposed on the light emitting elements LD. The second insulating layer INS2 may be partially disposed on the light emitting elements LD. In case that the second insulating layer INS2 is formed on the light emitting elements LD after the alignment of the light emitting elements LD is completed, the light emitting elements LD may be prevented from being separated from an aligned position. The second insulating layer INS2 may be disposed on the light emitting elements LD and may expose the first and second ends EP1 and EP2 of the light emitting elements LD.

The second insulating layer INS2 may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first and second connection electrodes CNE1 and CNE2 may be respectively disposed on the first and second ends EP1 and EP2 of the light emitting elements LD exposed by the second insulating layer INS2. The first and second connection electrodes CNE1 and CNE2 may be disposed on or directly disposed on the first and second ends EP1 and EP2 of the light emitting elements LD, respectively, and thus the first and second connection electrodes CNE1 and CNE2 may contact the first and second ends EP1 and EP2 of the light emitting elements LD. The first connection electrode CNE1 may contact the first electrode ELT1 through a contact hole passing through the first insulating layer INS1 described above. The second connection electrode CNE2 may contact the second electrode ELT2 through a contact hole passing through the first insulating layer INS1.

In an embodiment, the first and second connection electrodes CNE1 and CNE2 may be disposed on a same layer as shown in FIG. 5. For example, the first and second connection electrodes CNE1 and CNE2 may be formed of a same conductive layer. The first and second connection electrodes CNE1 and CNE2 may be simultaneously formed in a same process, but are not limited thereto.

In an embodiment, the first and second connection electrodes CNE1 and CNE2 may be disposed on different layers. For example, as shown in FIG. 6, the second connection electrode CNE2 may be disposed on the first connection electrode CNE1. As described above, in case that the first and second connection electrodes CNE1 and CNE2 are formed of different conductive layers, a third insulating layer INS3 may be further disposed between the first connection electrode CNE1 and the second connection electrode CNE2. The third insulating layer INS3 may cover or overlap the first connection electrode CNE1 and expose the second end EP2 of the light emitting element LD. The second connection electrode CNE2 may be disposed on the second end EP2 of the light emitting element LD exposed by the third insulating layer INS3. As described above, in case that the third insulating layer INS3 is disposed between the connection electrodes CNE1 and CNE2 formed of different conductive layers, since the connection electrodes CNE1 and CNE2 may be stably separated by the third insulating layer INS3, electrical stability between the first and second ends EP1 and EP2 of the light emitting elements LD may be secured. Accordingly, a short defect may be effectively prevented from occurring between the first and second ends EP1 and EP2 of the light emitting elements LD.

Each of the first and second connection electrodes CNE1 and CNE2 may be formed of various transparent conductive materials. For example, the first and second connection electrodes CNE1 and CNE2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance. Accordingly, the light emitted from the first and second ends EP1 and EP2 of the light emitting elements LD may pass through the first and second connection electrodes CNE1 and CNE2 and may be emitted to an outside of the display panel PNL.

The third insulating layer INS3 may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Hereinafter, an embodiment is described. In the following embodiment, the same configuration as that already described is referred to by the same reference numeral, and a repetitive description is omitted or simplified.

Figure 7:
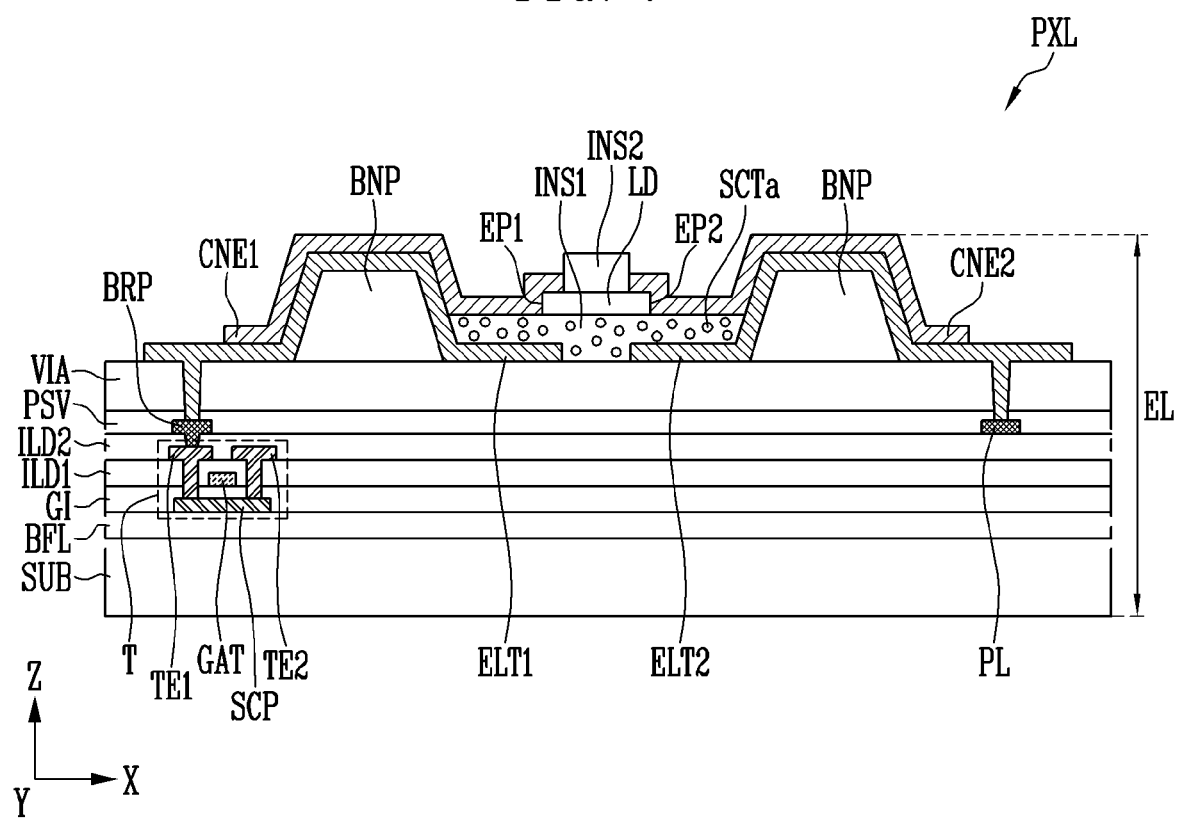
FIGS. 7 and 8 are schematic cross-sectional views illustrating a pixel according to an embodiment.
Figure 8:
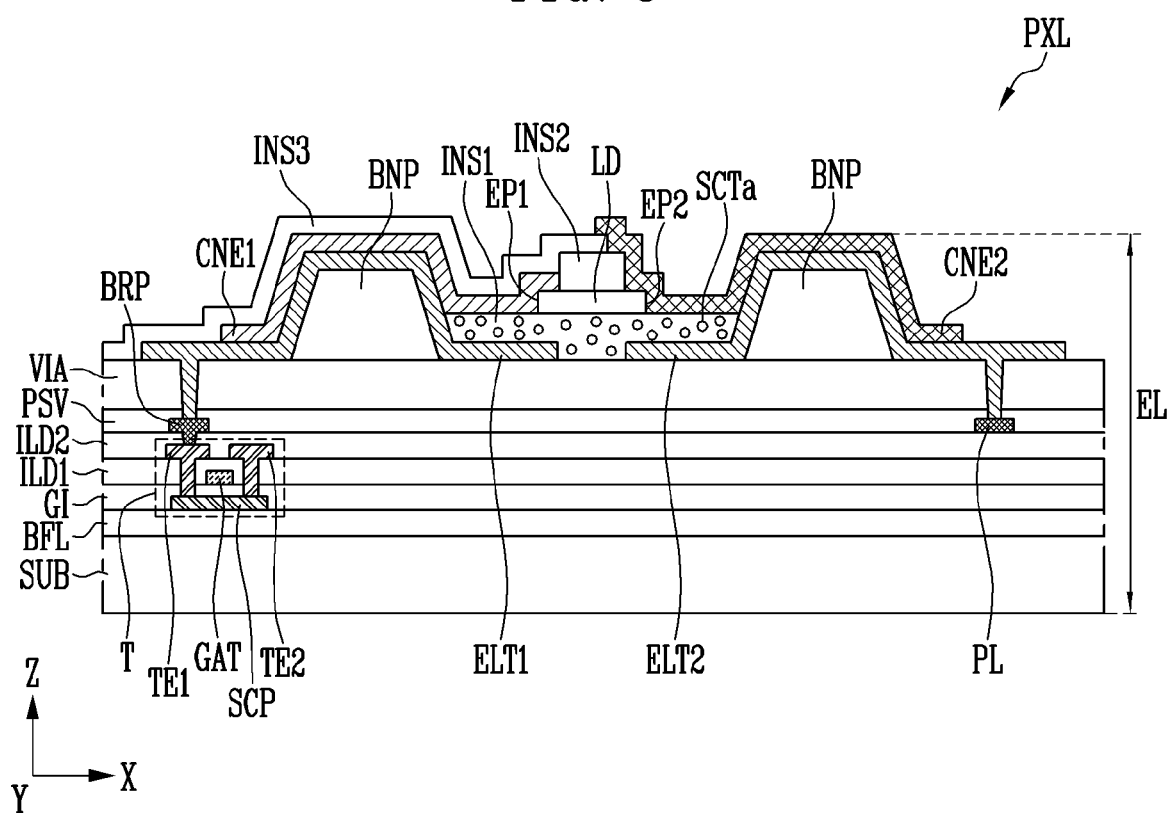

FIGS. 7 and 8 are schematic cross-sectional views illustrating a pixel according to an embodiment.

Referring to FIGS. 7 and 8, an embodiments may be distinguished from an embodiment of FIGS. 1 to 6, in that the first and second electrodes ELT1 and ELT2 may be disposed between the bank patterns BNP and the first insulating layer INS1.

The bank patterns BNP may be disposed on the via layer VIA. The bank patterns BNP may be disposed on or directly disposed on the via layer VIA. The first and second electrodes ELT1 and ELT2 may be disposed on the bank patterns BNP. The first and second electrodes ELT1 and ELT2 disposed on the bank patterns BNP may include an inclined surface or a curved surface having a shape corresponding to a shape of the bank patterns BNP. Accordingly, the bank patterns BNP may function as a reflective member that improves light emission efficiency of the display panel PNL by guiding the light emitted from the light emitting elements LD in the front surface direction of the pixel PXL, for example, in the third direction (Z-axis direction), together with the first and second electrodes ELT1 and ELT2 provided on the bank patterns BNP.

The first insulating layer INS1 may be disposed on the first and second electrodes ELT1 and ELT2. As described above, the first insulating layer INS1 may be formed of an organic layer including the scatterer SCTa. Accordingly, the first and second electrodes ELT1 and ELT2 and the light emitting elements LD may be spaced apart by a distance by the first insulating layer INS1. Therefore, since a phenomenon in which the light emitting elements LD are separated may be minimized, the light emitting elements LD may be stably aligned. The light emitted downward from the light emitting elements LD may be recycled by the scatterer SCTa of the first insulating layer INS1, and may be emitted in the front surface direction of the display panel PNL, for example, in the third direction (Z-axis direction). Accordingly, the light efficiency and the surface light source effect of the display device may be increased as described above.

The light emitting elements LD may be disposed on the first insulating layer INS1. The light emitting elements LD may be disposed between the first and second electrodes ELT1 and ELT2 on the first insulating layer INS1.

The bank patterns BNP, the first and second electrodes ELT1 and ELT2, the light emitting elements LD, and/or the first insulating layer INS1 are/is described in detail with reference to FIGS. 1 to 6, and thus a repetitive description is omitted.

FIGS. 9 to 12 are schematic cross-sectional views illustrating a pixel according to an embodiment.

Referring to FIGS. 9 to 12, embodiments may be distinguished from embodiments of FIGS. 1 to 8, in that the bank patterns BNP may include a scatterer SCTb.

The first and second electrodes ELT1 and ELT2 may be disposed on or directly disposed on the via layer VIA. The first and second electrodes ELT1 and ELT2 may be flatly disposed along one surface or a surface of the via layer VIA. For example, the first and second electrodes ELT1 and ELT2 may be disposed on a same plane or may be coplanar.

The first electrode ELT1 may be electrically connected to the bridge pattern BRP disposed thereunder through a contact hole passing through the via layer VIA and/or the protective layer PSV. The second electrode ELT2 may be electrically connected to the power line PL disposed thereunder through a contact hole passing through the via layer VIA and/or the protective layer PSV. As described above, in case that the first and second electrodes ELT1 and ELT2 are formed on or directly formed on the via layer VIA, since the first and second electrodes ELT1 and ELT2 and the circuit elements disposed thereunder are stably connected, a contact defect may be minimized as described above.

The bank patterns BNP may be disposed on the first and second electrodes ELT1 and ELT2. The bank patterns BNP may be disposed to overlap the first and second electrodes ELT1 and ELT2 in the third direction (Z-axis direction), respectively.

In an embodiment, the bank patterns BNP may include the scatterer SCTb to efficiently use the light emitted from the light emitting elements LD. For example, the scatterer SCTb of the bank patterns BNP may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto. The light emitted laterally from the light emitting elements LD may be recycled by the scatterer SCTb of the bank patterns BNP and may be emitted in the front surface direction of the display panel PNL, for example, in the third direction (Z-axis direction). Accordingly, since a light amount lost to a side surface of the display panel PNL may be minimized, the front surface light emission efficiency of the display device may be improved. Since the luminance difference according to the emission area in the pixel PXL may be improved, the surface light source effect may be increased.

Figure 9:
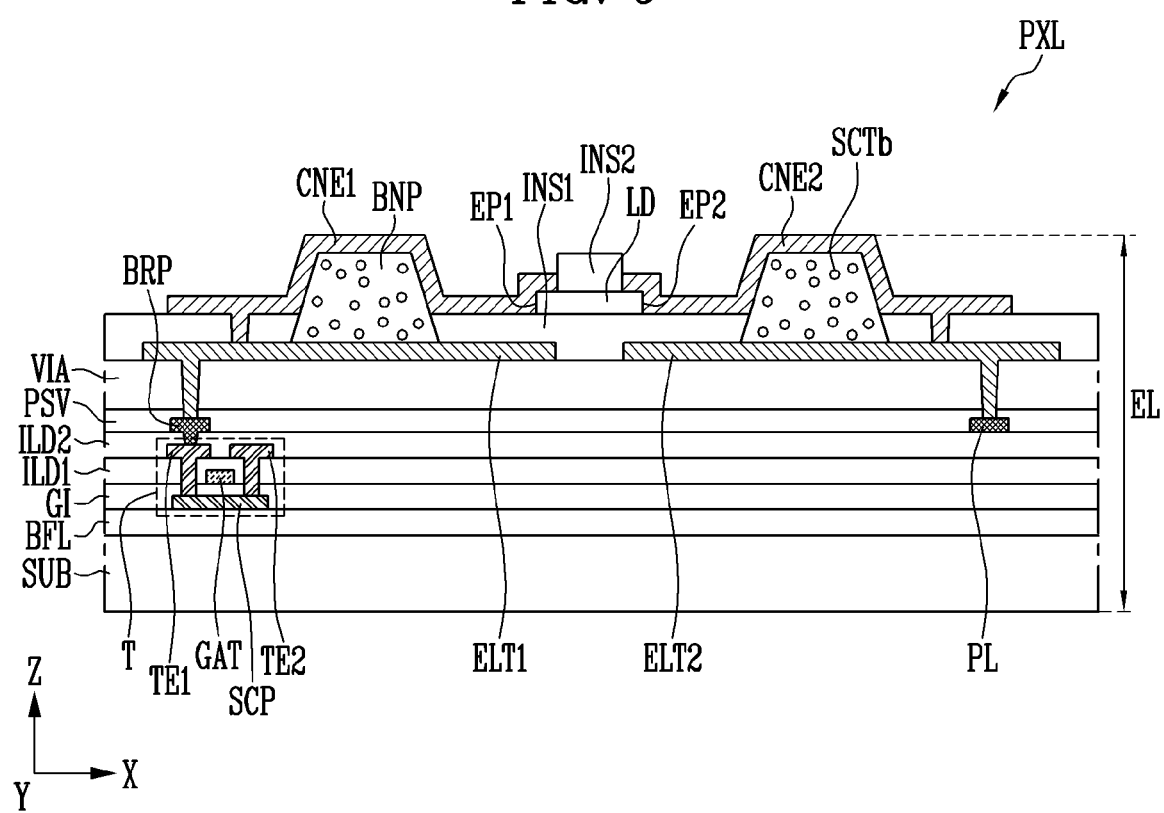
FIGS. 9 to 12 are schematic cross-sectional views illustrating a pixel according to an embodiment.

The first insulating layer INS1 may be disposed on the first and second electrodes ELT1 and ELT2. In an embodiment, the first insulating layer INS1 may be disposed on the first and second electrodes ELT1 and ELT2 and the bank patterns BNP as shown in FIG. 9. For example, the bank patterns BNP may be disposed between the first and second electrodes ELT1 and ELT2 and the first insulating layer INS1. The bank patterns BNP may be disposed on or directly disposed on the first and second electrodes ELT1 and ELT2. The first insulating layer INS1 may be disposed on or directly disposed on the first and second electrodes ELT1 and ELT2 and the bank patterns BNP.

Figure 10:
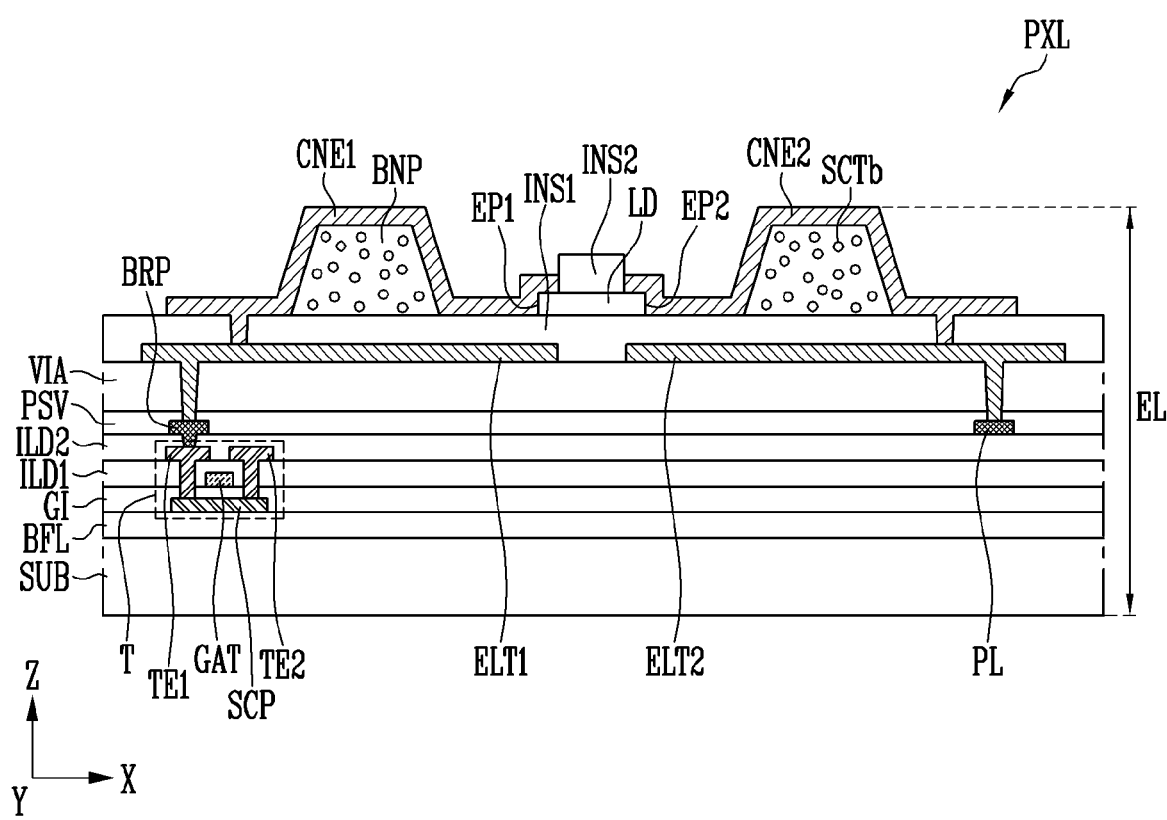

In an embodiment, the first insulating layer INS1 may be disposed between the first and second electrodes ELT1 and ELT2 and the bank patterns BNP as shown in FIG. 10. The first insulating layer INS1 may be disposed on or directly disposed on the first and second electrodes ELT1 and ELT2. The bank patterns BNP may be disposed on or directly disposed on the first insulating layer INS1.

As described above, the first insulating layer INS1 may be formed of an organic layer. In case that the first insulating layer INS1 is formed of an organic layer, since the first insulating layer INS1 may be formed to have a relatively thick thickness, the first and second electrodes ELT1 and ELT2 and the light emitting elements LD may be spaced apart from each other at a distance. Accordingly, a phenomenon in which the light emitting elements LD are separated may be minimized, and thus the light emitting elements LD may be stably aligned as described above.

Figure 11:
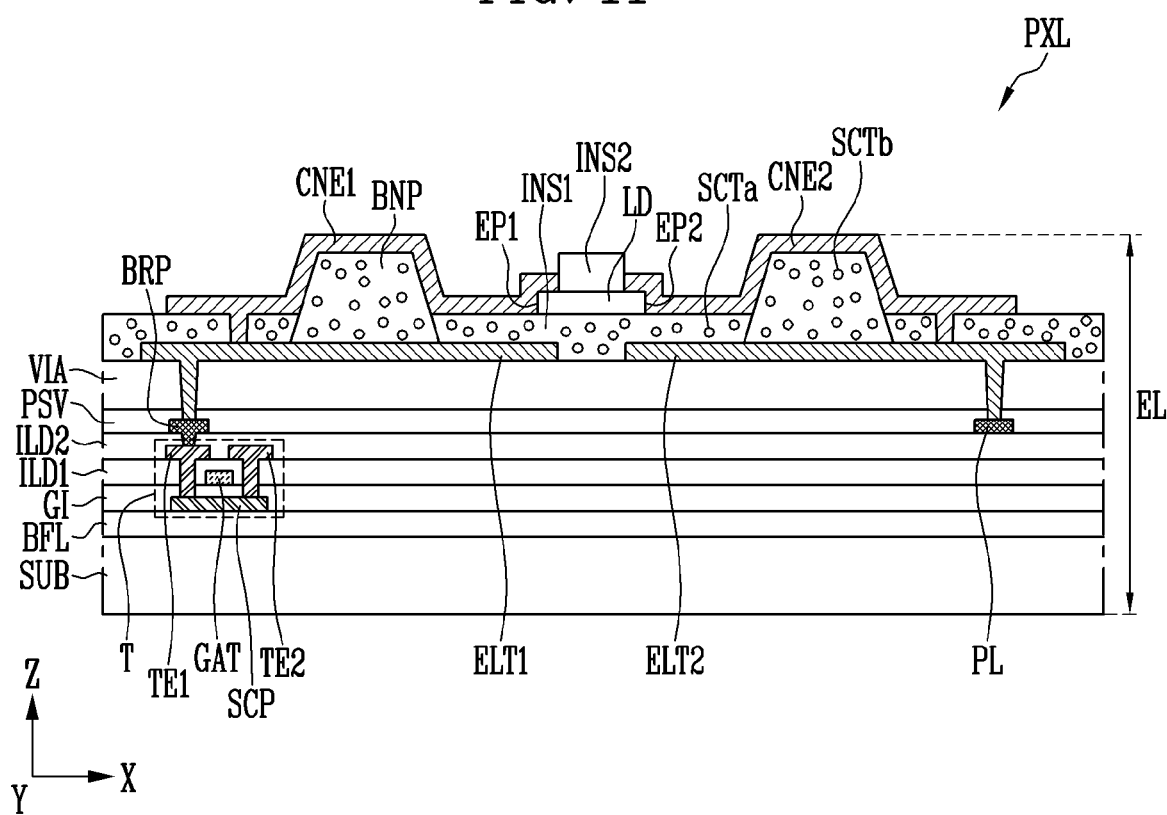

According to an embodiment, the first insulating layer INS1 may include the scatterer SCTa as shown in FIG. 11. For example, the scatterer SCTa of the first insulating layer INS1 may include a same material or a similar material as the scatterer SCTb of the bank patterns BNP, but is not limited thereto. The scatterer SCTa of the first insulating layer INS1 may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto. The light emitted downward from the light emitting elements LD may be recycled by the scatterer SCTa of the first insulating layer INS1 and may be emitted in the front surface direction of the display panel PNL, for example, in the third direction (Z-axis direction). Accordingly, the light efficiency and the surface light source effect of the display device may be increased as described above.

The light emitting elements LD may be disposed on the first insulating layer INS1. The light emitting elements LD may be disposed between the first and second electrodes ELT1 and ELT2 on the first insulating layer INS1.

The second insulating layer INS2 may be disposed on the light emitting elements LD. The second insulating layer INS2 may be disposed on the light emitting elements LD, and may expose the first and second ends EP1 and EP2 of the light emitting elements LD.

The first and second connection electrodes CNE1 and CNE2 may be respectively disposed on the first and second ends EP1 and EP2 of the light emitting elements LD exposed by the second insulating layer INS2. The first and second connection electrodes CNE1 and CNE2 may be disposed on or directly disposed on the first and second ends EP1 and EP2 of the light emitting elements LD, respectively, and thus the first and second connection electrodes CNE1 and CNE2 may contact the first and second ends EP1 and EP2 of the light emitting elements LD. The first connection electrode CNE1 may contact the first electrode ELT1 through a contact hole passing through the first insulating layer INS1 described above. The second connection electrode CNE2 may contact the second electrode ELT2 through a contact hole passing through the first insulating layer INS1.

The first and second connection electrodes CNE1 and CNE2 may be disposed on a same layer as shown in FIGS. 9 to 11. For example, the first and second connection electrodes CNE1 and CNE2 may be formed of a same conductive layer. The first and second connection electrodes CNE1 and CNE2 may be simultaneously formed in a same process, but are not limited thereto.

Figure 12:
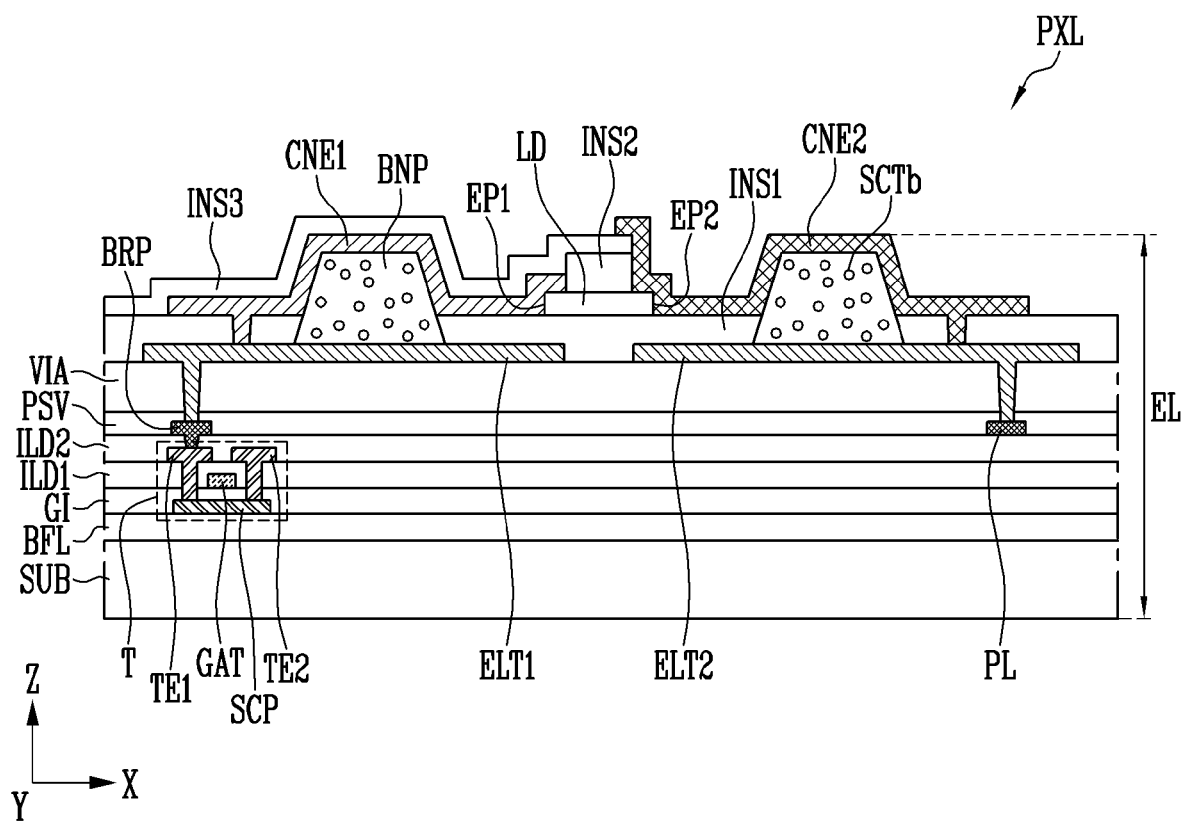

In an embodiment, the first and second connection electrodes CNE1 and CNE2 may be disposed on different layers. For example, as shown in FIG. 12, the second connection electrode CNE2 may be disposed on the first connection electrode CNE1. As described above, in case that the first and second connection electrodes CNE1 and CNE2 are formed of different conductive layers, the third insulating layer INS3 may be further disposed between the first connection electrode CNE1 and the second connection electrode CNE2. The third insulating layer INS3 may cover or overlap the first connection electrode CNE1 and expose the second end EP2 of the light emitting element LD. The second connection electrode CNE2 may be disposed on the second end EP2 of the light emitting element LD exposed by the third insulating layer INS3. As described above, in case that the third insulating layer INS3 is disposed between the connection electrodes CNE1 and CNE2 formed of different conductive layers, since the connection electrodes CNE1 and CNE2 may be stably separated by the third insulating layer INS3, electrical stability between the first and second ends EP1 and EP2 of the light emitting elements LD may be secured. Accordingly, a short defect may be effectively prevented from occurring between the first and second ends EP1 and EP2 of the light emitting elements LD.

Figure 13:
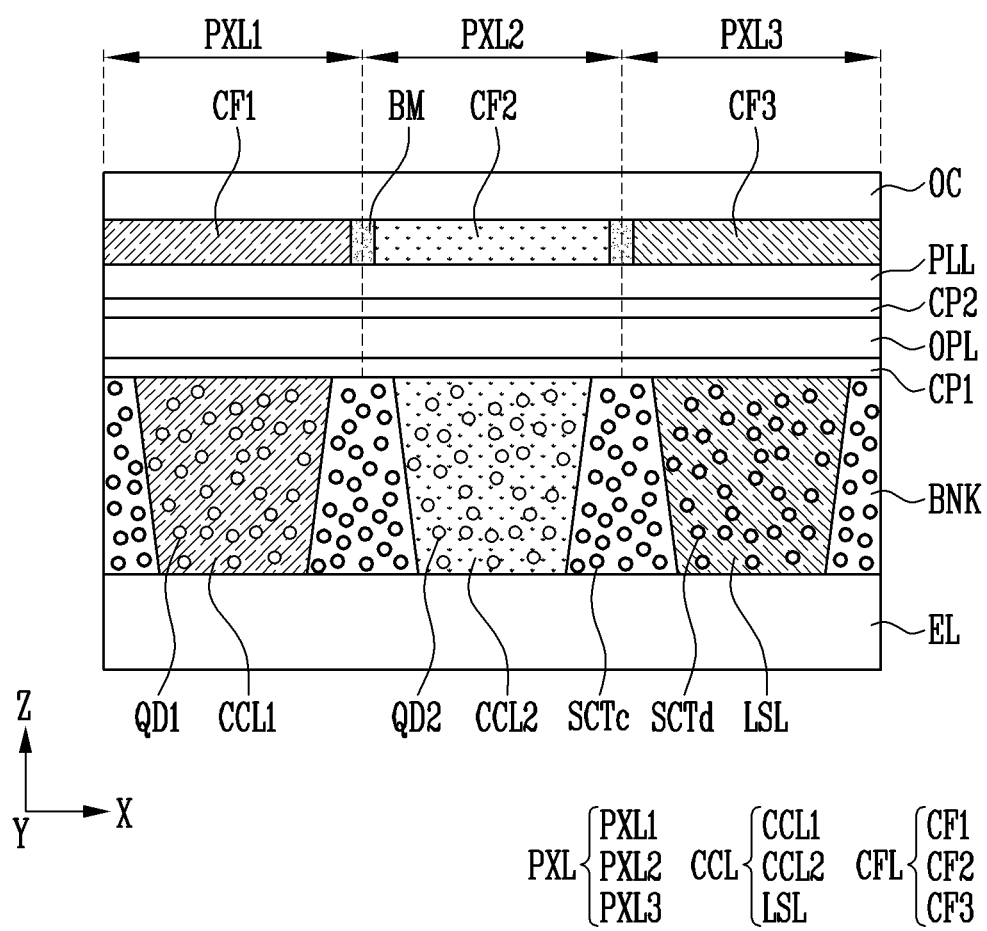
FIG. 13 is a schematic cross-sectional view illustrating first to third pixels according to an embodiment.

FIG. 13 is a schematic cross-sectional view illustrating first to third pixels according to an embodiment.

FIG. 13 shows a bank BNK, a color conversion layer CCL, a color filter layer CFL, and/or the like provided or disposed on the light emitting element layer EL of the pixel PXL described above.

Referring to FIG. 13, the bank BNK may be disposed on the light emitting element layer EL of the first to third pixels PXL1, PXL2, and PXL3. For example, the bank BNK may be disposed between or at a boundary between the first to third pixels PXL1, PXL2, and PXL3, and may include an opening overlapping each of the first to third pixels PXL1, PXL2, and PXL3. The opening of the bank BNK may provide a space in which the color conversion layer CCL may be provided.

In an embodiment, the bank BNK may include a scatterer SCTc to improve light efficiency. For example, the scatterer SCTc of the bank BNK may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto. Since the light emitted from the light emitting elements LD may be recycled by the scatterer SCTc of the bank BNK and may be emitted in the front surface direction of the display panel PNL, for example, in the third direction (Z-axis direction), the light efficiency may be improved.

For example, the scatterer SCTc of the bank BNK may include a same material or a similar material as the scatterer SCTa of the first insulating layer INS1 and/or the scatterer SCTb of the bank patterns BNP, but is not limited thereto.

The bank BNK may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank BNK may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

According to an embodiment, the bank BNK may include at least one light blocking and/or reflective material. Accordingly, light leakage between the adjacent pixels PXL may be prevented. For example, the bank BNK may include at least one black matrix material, color filter material, and/or the like within the spirit and the scope of the disclosure. For example, the bank BNK may be formed of a black opaque pattern that blocks the transmission of light. In an embodiment, a reflective film or the like, which is not shown, may be formed on a surface (for example, a sidewall) of the bank BNK to increase light efficiency of each pixel PXL.

The color conversion layer CCL may be disposed on the light emitting element layer EL including the light emitting elements LD in the opening of the bank BNK. The color conversion layer CCL may include a first color conversion layer CCL1 disposed in the first pixel PXL1, a second color conversion layer CCL2 disposed in the second pixel PXL2, and a scattering layer LSL disposed in the third pixel PXL3.

In an embodiment, the first to third pixels PXL1, PXL2, and PXL3 may include light emitting elements LD that emit light of a same color. For example, the first to third pixels PXL1, PXL2, and PXL3 may include light emitting elements LD emitting light of a third color (or blue). The color conversion layer CCL including color conversion particles may be disposed on each of the first to third pixels PXL1, PXL2, and PXL3 to display a full-color image.

The first color conversion layer CCL1 may include first color conversion particles that convert light of the third color emitted from the light emitting element LD into light of the first color. For example, the first color conversion layer CCL1 may include first quantum dots QD1 dispersed in a matrix material such as a base resin.

In an embodiment, in case that the light emitting element LD is a blue light emitting element emitting blue light and the first pixel PXL1 is a red pixel, the first color conversion layer CCL1 may include the first quantum dot QD1 that converts the blue light emitted from the blue light emitting element into red light. The first quantum dot QD1 may absorb the blue light and shift a wavelength according to an energy transition to emit the red light. In case that the first pixel PXL1 is a pixel of a different color, the first color conversion layer CCL1 may include a first quantum dot QD1 corresponding to the color of the first pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material such as a base resin.

In an embodiment, in case that the light emitting element LD is the blue light emitting element emitting the blue light and the second pixel PXL2 is a green pixel, the second color conversion layer CCL2 may include a second quantum dot QD2 that converts the blue light emitted from the blue light emitting element into green light. The second quantum dot QD2 may absorb the blue light and shift a wavelength according to an energy transition to emit the green light. In case that the second pixel PXL2 is a pixel of a different color, the second color conversion layer CCL2 may include a second quantum dot QD2 corresponding to the color of the second pixel PXL2.

In an embodiment, an absorption coefficient of the first quantum dot QD1 and the second quantum dot QD2 may be increased by allowing the blue light having a relatively short wavelength in a visible light region to be incident on each of the first quantum dot QD1 and the second quantum dot QD2. Accordingly, finally, efficiency of light emitted from the first pixel PXL1 and the second pixel PXL2 may be improved, and excellent color reproducibility may be secured. Manufacturing efficiency of the display device may be increased, by forming the light emitting unit LSU of the first to third pixels PXL1, PXL2, and PXL3 using the light emitting elements LD of a same color (for example, the blue light emitting element).

The scattering layer LSL may be provided to efficiently use the light of the third color (or blue) emitted from the light emitting element LD. For example, in case that the light emitting element LD is the blue light emitting element emitting the blue light and the third pixel PXL3 is the blue pixel, the scattering layer LSL may include at least one type of scatterer SCT in order to efficiently use the light emitted from the light emitting element LD.

For example, the scattering layer LSL may include scatterers SCTd dispersed in a matrix material such as a base resin. The scatterer SCTd of the scattering layer LSL may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto. For example, the scatterer SCTd of the scattering layer LSL may include a same material or a similar material as the scatterer SCTa of the first insulating layer INS1, the scatterer SCTb of the bank patterns BNP, and/or the scatterer SCTc of the bank BNK described above, but is not limited thereto.

In the drawing, a case in which only the scattering layer LSL may include the scatterer SCTd is shown, but the disclosure is not limited thereto, and the scatterer may also be included in the first color conversion layer CCL1 or the second color conversion layer CCL2 selectively. According to an embodiment, the scatterer SCTd of the scattering layer LSL may be omitted, and the scattering layer LSL formed of a transparent polymer may be provided.

A first capping layer CP1 may be disposed on the color conversion layer CCL. The first capping layer CP1 may be provided over the first to third pixels PXL1, PXL2, and PXL3. The first capping layer CP1 may cover or overlap the color conversion layer CCL. The first capping layer CP1 may prevent an impurity such as moisture or air from penetrating from the outside and damaging or contaminating the color conversion layer CCL.

The first capping layer CP1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like within the spirit and the scope of the disclosure.

An optical layer OPL may be disposed on the first capping layer CP1. The optical layer OPL may be provided over the first to third pixels PXL1, PXL2, and PXL3.

The optical layer OPL may serve to improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to 2.0, and the refractive index of the optical layer OPL may be about 1.1 to 1.3, but are not limited thereto.

According to an embodiment, the optical layer OPL may include a base resin and a hollow particle dispersed in the base resin. The hollow particle may include a hollow silica particle. For example, the hollow particle may be a pore formed by porogen, but is not limited thereto. The optical layer OPL may include at least one of titanium dioxide ($TiO_2$), silicon dioxide ($SiO_2$), silicon nitride ($Si_3N_4$), aluminum oxide ($Al_2O_3$), barium sulfate ($BaSO_4$), and calcium carbonate ($CaCO_3$), but is not limited thereto.

A second capping layer CP2 may be disposed on the optical layer OPL. The second capping layer CP2 may be provided over the first to third pixels PXL1, PXL2, and PXL3. The second capping layer CP2 may cover or overlap the optical layer OPL. The second capping layer CP2 may prevent an impurity such as moisture or air from penetrating from the outside and damaging or contaminating the optical layer OPL.

The second capping layer CP2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like within the spirit and the scope of the disclosure.

A planarization layer PLL may be disposed on the second capping layer CP2. The planarization layer PLL may be provided over the first to third pixels PXL1, PXL2, and PXL3.

The planarization layer PLL may include an organic material such as acrylates resin, epoxy resin, phenolic resin, polyamides resin, polyimides resin, polyester resin, polyphenylenesulfides resin, or benzocyclobutene (BCB). However, the disclosure is not limited thereto, and the planarization layer PLL may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The color filter layer CFL may be disposed on the planarization layer PLL. The color filter layer CFL may include color filters CF1, CF2, and CF3 matching the colors of each pixel PXL. As the color filters CF1, CF2, and CF3 matching the colors of each of the first to third pixels PXL1, PXL2, and PXL3 are disposed, the full-color image may be displayed.

The color filter layer CFL may include the first color filter CF1 disposed in the first pixel PXL1 to selectively transmit light emitted from the first pixel PXL1, the second color filter CF2 disposed in the second pixel PXL2 to selectively transmit light emitted from the second pixel PXL2, and the third color filter CF3 disposed in the third pixel PXL3 to selectively transmit light emitted from the third pixel PXL3.

In an embodiment, the first color filter CF1, the second color filter CF2, and the third color filter CF3 may be a red color filter, a green color filter, and a blue color filter, respectively, but are not limited thereto. Hereinafter, in case that any color filter among the first color filter CF1, the second color filter CF2, and the third color filter CF3 is refer to, or two or more types of color filters are collectively refer to, the any color filter or the two or more types of color filters is referred to as a "color filter CF" or "color filters CF".

The first color filter CF1 may overlap the light emitting element layer EL (or the light emitting element LD) and the first color conversion layer CCL1 of the first pixel PXL1 in the third direction (Z-axis direction). The first color filter CF1 may include a color filter material that selectively transmits the light of the first color (or red). For example, in case that the first pixel PXL1 is the red pixel, the first color filter CF1 may include a red color filter material.

The second color filter CF2 may overlap the light emitting element layer EL (or the light emitting element LD) and the second color conversion layer CCL2 of the second pixel PXL2 in the third direction (Z-axis direction). The second color filter CF2 may include a color filter material that selectively transmits the light of the second color (or green). For example, in case that the second pixel PXL2 is the green pixel, the second color filter CF2 may include a green color filter material.

The third color filter CF3 may overlap the light emitting element layer EL (or the light emitting element LD) and the scattering layer LSL of the third pixel PXL3 in the third direction (Z-axis direction). The third color filter CF3 may include a color filter material that selectively transmits the light of the third color (or blue). For example, in case that the third pixel PXL3 is the blue pixel, the third color filter CF3 may include a blue color filter material.

According to an embodiment, a light blocking layer BM may be further disposed among the first to third color filters CF1, CF2, and CF3. As described above, the light blocking layer BM is formed among the first to third color filters CF1, CF2, and CF3, a color mixture defect visually recognized from a front or side of the display device. A material of the light blocking layer BM is not particularly limited, and may be formed of various light blocking materials. For example, the light blocking layer BM may be implemented by stacking the first to third color filters CF1, CF2, and CF3 on each other.

An overcoat layer OC may be disposed on the color filter layer CFL. The overcoat layer OC may be provided over the first to third pixels PXL1, PXL2, and PXL3. The overcoat layer OC may cover or overlap a lower member including the color filter layer CFL. The overcoat layer OC may prevent moisture or air from penetrating into the above-described lower member. The overcoat layer OC may protect the above-described lower member from a foreign substance such as dust.

The overcoat layer OC may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the overcoat layer OC may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Those skilled in the art will understand that the disclosure may be implemented in a modified form or forms without departing from the above-described embodiments. Therefore, the disclosed embodiments should be considered in a descriptive sense and not for purposes of limitation. The scope of the disclosure is included in the claims as well as the above description, and all variations within the scope of the disclosure will be construed as being included in the disclosure.

What is claimed is:

1. A display device comprising:
   a substrate including pixels;
   a first electrode and a second electrode spaced apart from each other on the substrate;
   an organic layer disposed on the first electrode and the second electrode; and
   light emitting elements disposed on the organic layer between the first electrode and the second electrode,
   wherein the organic layer includes a scatterer.

2. The display device according to claim 1, further comprising:
   bank patterns disposed on the substrate,
   wherein the light emitting elements are disposed between the bank patterns.

3. The display device according to claim 2, wherein the bank patterns are disposed on the organic layer.

4. The display device according to claim 2, wherein the first electrode and the second electrode are disposed between the bank patterns and the organic layer.

5. The display device according to claim 2, wherein the organic layer and the bank patterns include a same material.

6. The display device according to claim 2, wherein the bank patterns include a light blocking material.

7. The display device according to claim 1, wherein the scatterer included in the organic layer includes at least one of titanium dioxide ($TiO_2$), silicon dioxide ($SiO_2$), silicon nitride ($Si_3N_4$), aluminum oxide ($Al_2O_3$), barium sulfate ($BaSO_4$), or calcium carbonate ($CaCO_3$).

8. The display device according to claim 1, further comprising:
   a first connection electrode electrically contacting the first electrode to an end of the light emitting elements;
   a second connection electrode electrically contacting the second electrode to another end of the light emitting elements; and
   an insulating layer disposed between the first connection electrode and the second connection electrode.

9. The display device according to claim 8, wherein a thickness of the organic layer is greater than a thickness of the insulating layer.

* * * * *